United States Patent
Eom et al.

(10) Patent No.: US 6,927,077 B2
(45) Date of Patent: Aug. 9, 2005

(54) METHOD AND APPARATUS FOR MEASURING CONTAMINATION OF A SEMICONDUCTOR SUBSTRATE

(75) Inventors: Tae-Min Eom, Sungnam (KR); Yu-Sin Yang, Seoul (KR); Kwan-Woo Ryu, Suwon (KR); Park-Song Kim, Gwangju (KR); Sang-Mun Chon, Yongin (KR); Sun-Yong Choi, Sungnam (KR); Chung-Sam Jun, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 84 days.

(21) Appl. No.: 10/704,753

(22) Filed: Nov. 12, 2003

(65) Prior Publication Data

US 2004/0100298 A1 May 27, 2004

(30) Foreign Application Priority Data

Nov. 27, 2002 (KR) ................................ 10-2002-0074473

(51) Int. Cl.$^7$ ........................ H01L 21/00; G01N 21/00; G01R 31/302
(52) U.S. Cl. ........................ 438/5; 438/14; 356/237.2; 324/750
(58) Field of Search ........................ 324/766, 750–753; 438/5, 7, 10, 11, 14, 16, 17; 702/81–84; 356/620, 433–436, 237.2, 237.3, 237.4, 237.5

(56) References Cited

U.S. PATENT DOCUMENTS

| 5,087,876 A | | 2/1992 | Reiss et al. |
| 5,963,315 A | * | 10/1999 | Hiatt et al. ............... 356/237.3 |
| 6,627,466 B1 | * | 9/2003 | Berman et al. ............... 438/14 |

FOREIGN PATENT DOCUMENTS

JP 9-139342 6/1997

* cited by examiner

Primary Examiner—Evan Pert
(74) Attorney, Agent, or Firm—Lee & Morse, P.C.

(57) ABSTRACT

An apparatus for measuring contamination of a semiconductor substrate includes a chuck for loading a substrate, a position detection means for recognizing a front surface of the loaded substrate to obtain position data of a portion of the substrate to be measured, a first driving part for moving the chuck in accordance with the position data to measure a rear portion of the substrate, and a surface measurement means disposed under the chuck for selectively measuring metal contamination of the substrate at the rear portion of the substrate. In operation, the substrate is loaded onto a chuck, position data of a portion of the substrate to be measured is obtained by recognizing patterns formed on the substrate, the substrate is then moved in accordance with the position data to measure a rear portion of the substrate, and metal contamination is selectively measured at the rear portion of the substrate.

21 Claims, 6 Drawing Sheets

METHOD AND APPARATUS FOR MEASURING CONTAMINATION OF A SEMICONDUCTOR SUBSTRATE

BACKGROUND OF THE INVENTION

1. Field of the Invention

The present invention relates to a method and an apparatus for measuring contamination of a semiconductor substrate. More particularly, the present invention relates to a method and an apparatus for selectively measuring a metal contamination of a substrate, wherein the substrate has patterns formed on a surface thereof.

2. Description of the Related Art

As a design rule of a semiconductor device is reduced, contamination of a substrate caused by various sources becomes more serious because a failure of the semiconductor device may be generally induced by contamination of the substrate. Thus, a method for monitoring a level of contamination of the substrate has been emphasized. Particularly, an interior and a surface of a semiconductor substrate including silicon may be easily contaminated by undesirable metal sources, such as iron, copper, aluminum and the like, during semiconductor manufacturing processes. These metal contamination sources may be rapidly diffused into the semiconductor substrate including silicon thereby causing a failure of the semiconductor device.

In general, there are two methods for measuring contamination of a semiconductor substrate caused by metal sources. A first method is a direct measuring method, such as a secondary ion mass spectrometric method. A second method is an indirect measuring method, such as a surface photo voltage (SPV) measurement method. In the SPV measurement method, the contamination of the substrate caused by metal sources can be indirectly measured by detecting diffusion distances and life times of minority carriers.

The SPV measurement method has been widely utilized because this method does not require an additional sample to measure contamination and the level of contamination can be measured with respect to an entire surface of the semiconductor substrate.

Disadvantageously, the SPV measurement method may not be performed on a semiconductor substrate including patterns formed thereon to measure a level of contamination of the semiconductor substrate. When a surface photo voltage is directly measured on a semiconductor substrate where the patterns are positioned, light incident on the substrate for measuring the surface photo voltage may be scattered by the patterns on the substrate. As result, an induced current induced from the surface of the substrate may be distorted such that the surface photo voltage may not be precisely measured. To overcome this disadvantage, an additional substrate that does not include the patterns is employed to measure the level of contamination of the substrate. Therefore, the SPV measurement method may not be directly employed for a substrate including patterns formed through the semiconductor manufacturing processes.

Further, to measure the level of the contamination over the entire surface of the substrate, the surface photo voltages are measured at previously set portions of a front surface of the substrate being monitored. Obtained data of the contamination of the substrate being monitored are outputted with respect to each portion of the substrate as a map shape using the measured surface photo voltages. However, when a contamination occurs locally at a very small portion of the substrate that includes patterns, that contamination of the substrate may not be detected because measurements taken from the previously set portions of the substrate may not represent the portions of the substrate where the contamination occurred.

SUMMARY OF THE INVENTION

In an effort to overcome at least some of the above-mentioned problems, a first feature of the present invention is to provide a method for measuring a metal contamination of a semiconductor substrate having patterns formed thereon.

A second feature of the present invention is to provide an apparatus for measuring a metal contamination of a semiconductor substrate having patterns formed thereon.

In accordance with an embodiment of the present invention, a method for measuring contamination of a substrate includes loading a substrate including patterns formed thereon onto a chuck, obtaining position data of a portion of the substrate to be measured by recognizing the patterns formed on the substrate, moving the substrate in accordance with the position data to measure a rear portion of the substrate corresponding to the portion of the substrate to be measured, and selectively measuring contamination of the substrate caused by a metal at the rear portion of the substrate corresponding to the portion of the substrate to be measured.

Preferably, obtaining the position data includes aligning a position of the substrate by optically recognizing shapes of the patterns formed on the substrate, defining a reference pattern among the patterns on the substrate, and obtaining position coordinates of the portion of the substrate to be measured using the reference pattern.

The method may further include aligning a position detection means with a surface measurement means before loading the substrate so that the position detection means is linearly aligned with the measurement means, wherein the portion of the substrate to be measured has a position identical to a position of the rear portion of the substrate. Preferably, aligning the position detection means includes irradiating light from the position detection means, sensing the irradiated light by the surface measurement means, determining whether a previously set portion of the surface measurement means detects a highest intensity of a light, and moving either the position detection means or the surface measurement means to detect the highest intensity of the light by the previously set portion of the surface measurement means. The substrate may be moved according to the position data recognized by the position detection means.

The method may further include obtaining a correction value of a misalignment between a position detection means and a surface measurement means by determining whether the portion of the substrate to be measured has a position identical to a position of the rear portion of the substrate prior to loading the substrate. Then, moving the substrate may include calculating a corrected position data by compensating the position data with the correction value of the misalignment, and moving the substrate in accordance with the corrected position data.

Selectively measuring contamination of the substrate may further include detecting a photo voltage at the rear portion of the substrate corresponding to the portion of the substrate to be measured, and measuring levels of contamination of an interior and a surface of the substrate caused by metal ions using the detected photo voltage.

In accordance with another embodiment of the present invention, an apparatus for measuring contamination of a substrate includes a chuck for loading a substrate, a position detection means for recognizing a front surface of the loaded substrate to obtain position data of a portion of the substrate to be measured, a first driving part coupled to the chuck for moving the chuck in accordance with the position data to measure a rear portion of the substrate corresponding to the portion of the substrate to be measured, and a surface measurement means disposed under the chuck for selectively measuring contamination of the substrate caused by a metal at the rear portion of the substrate.

The position detection means may include an image pick-up member for obtaining images of patterns formed on the substrate by optically recognizing the patterns on the substrate positioned on the chuck, and position coordinate computing member for defining a reference pattern on the substrate using the images of the patterns obtained from the image pick-up member, and for calculating positions of the substrate as position coordinates using the reference pattern.

The apparatus may further include a second driving part connected to the position detection means for moving the position detection means. The apparatus may also include an alignment means for aligning the position detection means with the surface measurement means. The alignment means may preferably includes a light generating member disposed at a side position of the position detection means for irradiating light toward the surface measurement means, and a light receiving sensor disposed at a side portion of the surface measurement means for receiving the light irradiated from the light generating member.

Preferably, the light receiving sensor detects a highest intensity of a light, and a degree that a previously set portion of the light receiving sensor deviates from the highest intensity of the light.

The apparatus may further include a data line connected to the light receiving sensor for feeding back a degree of a misalignment between the position detection means and the surface measurement means into the position coordinate computing member.

Preferably, the surface measurement means includes a light source for irradiating modulated light onto a predetermined portion of a rear surface of the substrate disposed on the chuck, a pick-up electrode for receiving a surface photo voltage signal from the rear surface of the substrate where the modulated light is irradiated, an amplifier connected to the pick-up electrode for amplifying a current induced by the pick-up electrode, and a detecting member for detecting a surface photo voltage using the amplified induced current.

The apparatus may further include a third driving part connected to the surface measurement means for moving the surface measurement means.

According to the embodiments of the present invention, contamination of a substrate can be directly measured on a rear surface of a substrate, wherein the substrate has patterns formed on a surface thereof. In addition, metal contamination of the substrate can be selectively measured with respect to a particular portion of the substrate. Accordingly, contamination of the substrate can be selectively measured with respect to portions of the substrate where contamination frequently occurs during semiconductor manufacturing processes.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
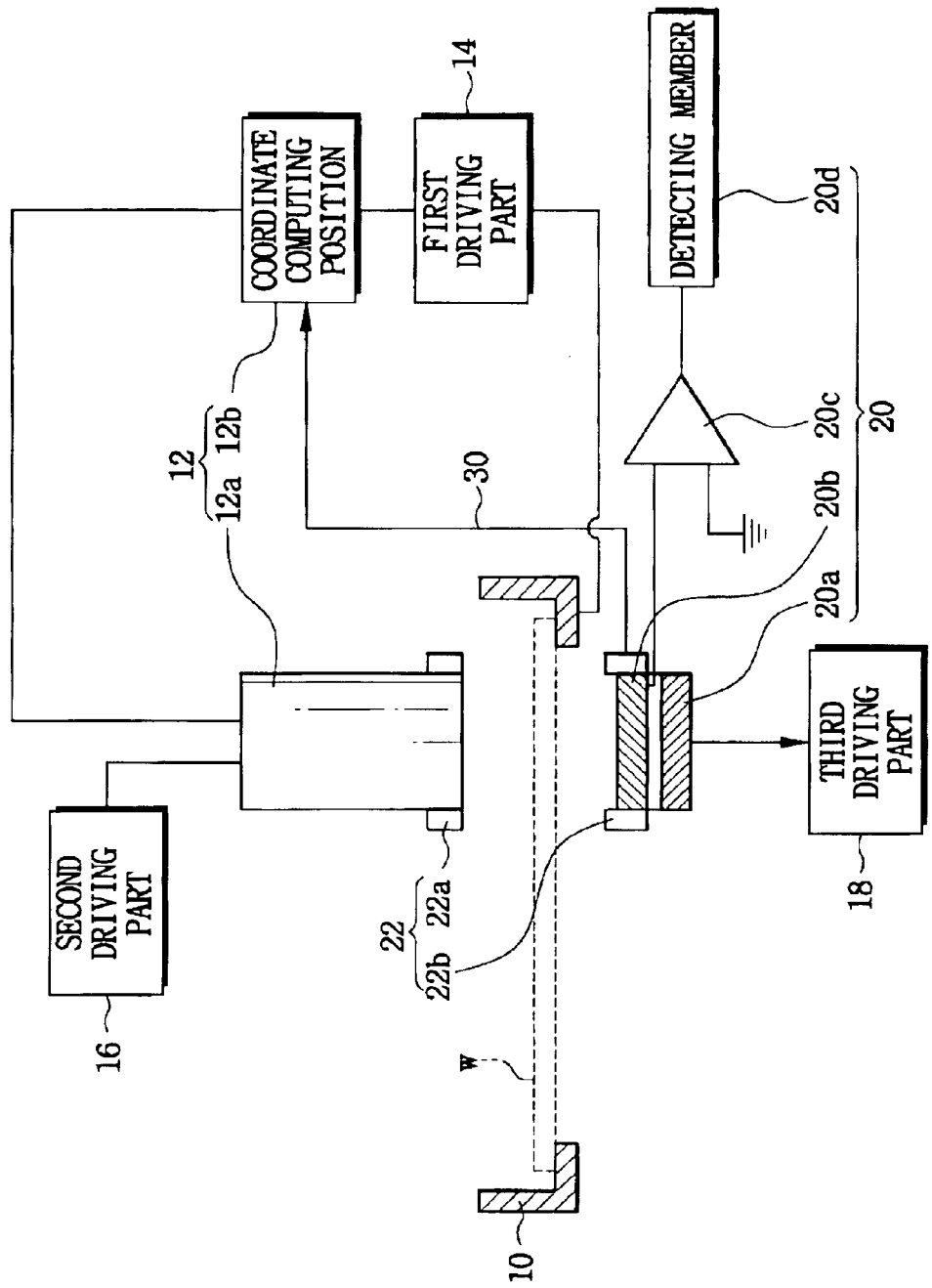
FIG. 1 illustrates a schematic cross-sectional view of an apparatus for measuring contamination of a semiconductor substrate according to a first embodiment of the present invention.

Korean Patent Application No. 2002-74473, filed on Nov. 27, 2002, and entitled: "Method and Apparatus for Measuring Contamination of a Semiconductor Substrate," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 illustrates a schematic cross-sectional view of an apparatus for measuring contamination according to a first embodiment of the present invention.

Referring to FIG. 1, an apparatus for measuring contamination of a semiconductor substrate includes a chuck 10 for loading the semiconductor substrate W. The chuck 10 supports the semiconductor substrate W by contacting a peripheral portion of a rear surface of the semiconductor substrate W. Other portions of the semiconductor substrate W are exposed except for the peripheral portion of the rear surface that is supported by the chuck 10. Predetermined patterns are formed on the semiconductor substrate W, which is loaded on the chuck 10, through semiconductor manufacturing processes.

A position detection unit 12 is disposed over the chuck 10 at a predetermined distance interval. To measure a contamination of the semiconductor substrate W, the position detection unit 12 recognizes position data of portions of the semiconductor substrate W to be measured while the chuck 10 holding the semiconductor substrate W moves below the position detection unit 12. The position detection unit 12 recognizes the patterns that are repeatedly formed on the semiconductor substrate W to obtain position coordinates of the portions of the semiconductor substrate W to be measured.

The position detection unit 12 includes an image pick-up member 12a for optically recognizing and photographing the patterns formed on the semiconductor substrate W supported by the chuck 10. The image pick-up member 12a preferably includes a charge-coupled device (CCD). The position detection unit 12 also includes a position coordinate computing member 12b for assigning a reference pattern among images of the patterns obtained by the image pick-up member 12a to convert a predetermined position of the semiconductor substrate W into a coordinate corresponding to the position using the reference pattern.

The position coordinate computing member 12b additionally includes a memory device for storing shapes and sizes of the patterns, and for storing an arrangement condition of the patterns. The position coordinate computing member 12b assigns the reference pattern a coordinate of (0, 0), and assigns corresponding coordinates (x, y) to the patterns identical to the reference pattern that are separated from the reference pattern in an X-axis direction and a Y-axis direction. In addition, the position coordinate computing member 12b obtains coordinates corresponding to the position of the semiconductor substrate W to be measured.

A first driving part 14 is operatively connected to the chuck 10 and to the position coordinate computing member 12b of the position detection unit 12. The first driving part 14 receives the position data of the position to be measured from the position detection unit 12 and moves the chuck 10 to measure a rear portion of the semiconductor substrate W corresponding to the position data.

A second driving part 16 is connected to the image pick-up member 12a of the position detection unit 12. The second driving part 16 moves the image pick-up member 12a over the semiconductor substrate W.

A surface measurement unit 20 is disposed under the chuck 10 at a predetermined distance interval. The surface measurement unit 20 measures contamination of the semiconductor substrate W caused by a metal beneath a rear surface of the semiconductor substrate W.

The surface measurement unit 20 includes a light source 20a for irradiating a modulated light onto a predetermined portion of the rear surface of the semiconductor substrate W positioned on the chuck 10. The light irradiated from the light source 20a penetrates from the rear surface of the semiconductor substrate W into a depth of about 150 $\mu$m. The surface measurement unit 20 also includes a pick-up electrode 20b for receiving a light voltage signal generated from the rear surface of the semiconductor substrate W after the light is irradiated onto the rear surface of the semiconductor substrate W. The surface measurement unit 20 further includes an amplifier 20c for amplifying an induced current induced from the light voltage signal. Additionally, the surface measurement unit 20 includes a detecting member 20d for detecting contamination of the semiconductor substrate W by calculating a surface photo voltage from the amplified induced current. The detecting member 20d is programmed to perform sequential steps of calculating the surface photo voltage from the induced current, calculating diffusion distances of minority carriers on the basis of a relation between the surface photo voltage and a wavelength of the light irradiated from the light source 20a, and determining a level of contamination of the semiconductor substrate W caused by a metal based on the diffusion distances of the minority carriers.

A third driving part 18 is operatively connected to the surface measurement unit 20. The third driving part 18 moves the pick-up electrode 20b and the light source 20a of the surface measurement unit 20.

The second and third driving parts 16 and 18 are provided for aligning positions of the position detection unit 12 and the surface measurement unit 20, respectively. Alignment of the position detection unit 12 and the surface measurement unit 20 may be achieved by moving one of the units relative to the other. Thus, only one of the second and third driving parts 16 and 18 is actually necessary to align the position detection unit 12 and the surface measurement unit 20.

An alignment unit 22, which includes a light generating member 22a and a light receiving sensor 22b, is provided at both side portions of the position detection and surface measurement units 12 and 20. The alignment unit 22 determines whether the portion of the semiconductor substrate W recognized by the position detection unit 12 is identical to the portion of the semiconductor substrate W whose surface photo voltage is measured by the surface measurement unit 20. The position detection unit 12 should linearly align with the surface measurement unit 20 in order to match the portion of the semiconductor substrate W recognized by the position detection unit 12 with the portion of the semiconductor substrate W measured by the surface measurement unit 20.

Figure 2:
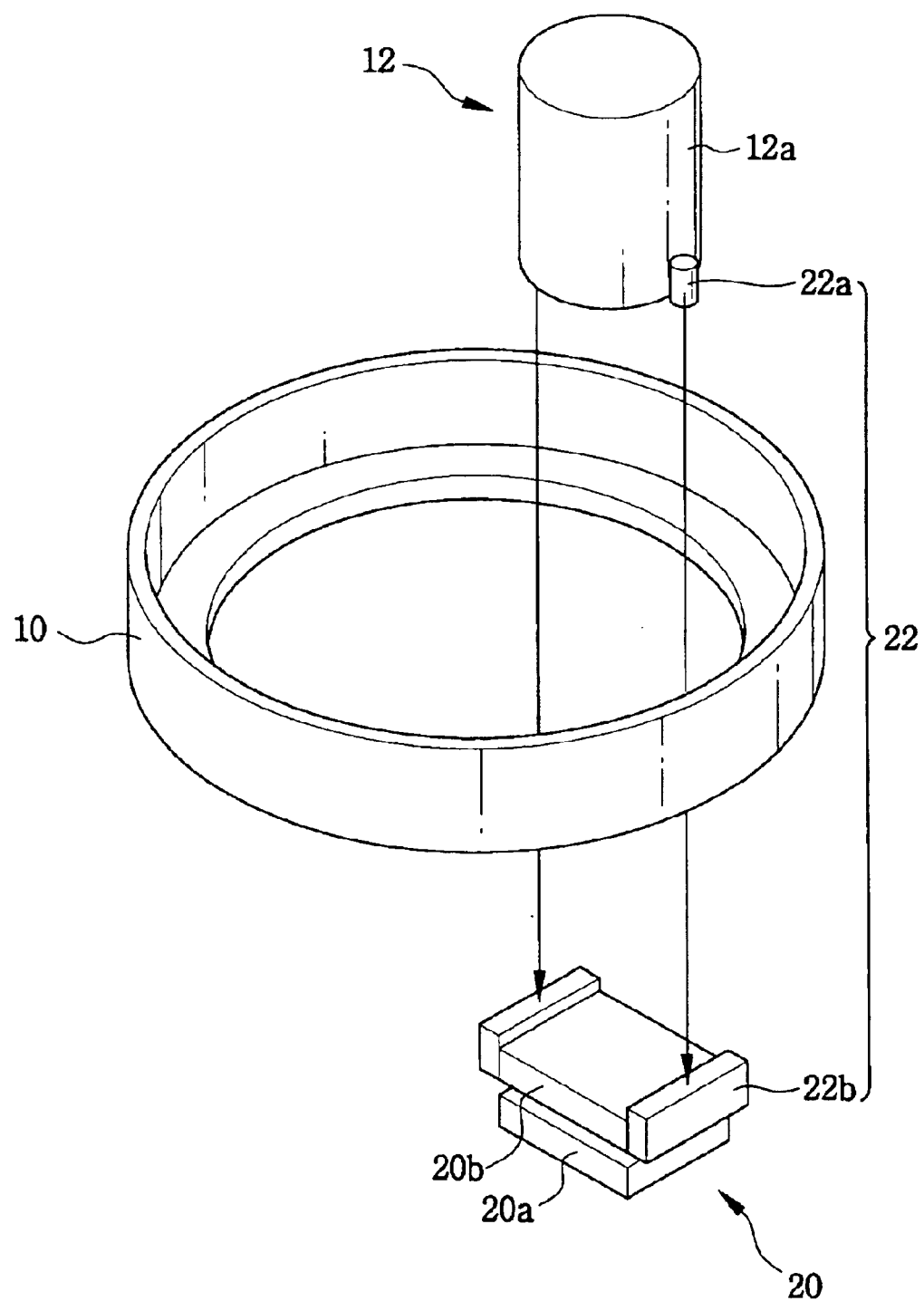
FIG. 2 illustrates an enlarged perspective view of an alignment unit of the apparatus for measuring contamination of a semiconductor substrate as shown in FIG. 1.

FIG. 2 illustrates an enlarged perspective view of the alignment unit 22 of the apparatus for measuring contamination of a semiconductor substrate as shown in FIG. 1.

Referring to FIGS. 1 and 2, the alignment unit 22 includes the light generating member 22a provided at a side portion of the image pick-up member 12a of the position detection unit 12. The light generating member 22a downwardly irradiates light toward the surface measurement unit 20. The alignment unit 22 also includes the light receiving sensor 22b provided at a side portion of the surface measurement unit 20 for sensing the light irradiated from the light generating member 22a. The light emitted from the light generating member 22a may include a laser. The light receiving sensor 22b detects an intensity of the irradiated light and a portion of the semiconductor substrate W having the highest intensity of the irradiated light. When a previously set portion of the light receiving sensor 22b detects the highest intensity of the light irradiated from the light generating member 22a, the position detection unit 12 is linearly aligned with the surface measurement unit 20.

Figure 3A:
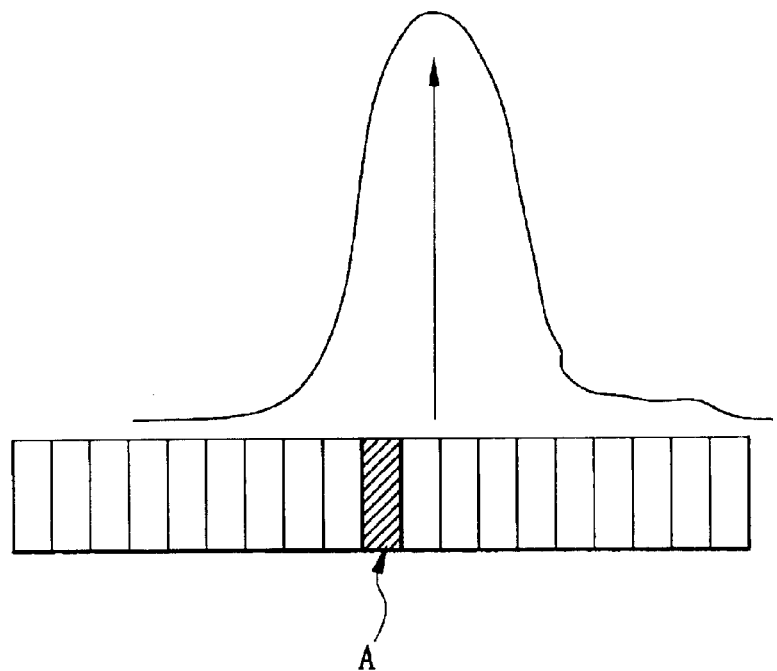
FIG. 3A is a schematic graph showing an intensity distribution of a light relative to portions of a light receiving sensor of the alignment unit in FIG. 2.

FIG. 3A is a schematic graph showing an intensity distribution of a light relative to portions of a light receiving sensor of the alignment unit as shown in FIG. 2. As shown in FIG. 3A, another portion of the light receiving sensor 22b, except the previously set portion A of the light receiving sensor 22b, detects the highest intensity of the light. This indicates a state in which the position detection unit 12 and the surface measurement unit 20 are not in alignment with one another.

Figure 3B:
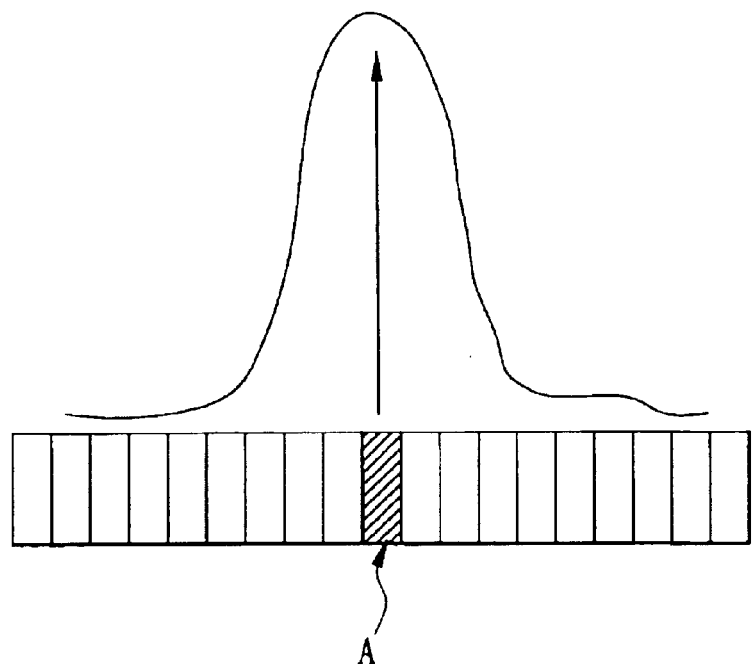
FIG. 3B is a schematic graph showing an intensity distribution of the light relative to the portions of the light receiving sensor of the alignment unit in FIG. 2.

FIG. 3B is a schematic graph showing an intensity distribution of the light relative to portions of the light receiving sensor of the alignment unit as shown in FIG. 2.

Referring to FIG. 3B, the previously set portion A of the light receiving sensor 22b detects the highest intensity of the light. That is, the position detection unit 12 and the surface measurement unit 20 are in alignment with one another.

Thus, it may be recognized whether the position detection unit 12 is linearly aligned with the surface measurement unit 20 if the previously set portion A of the light receiving sensor 22b detects the highest intensity of the light irradiated from the light generating member 22a. In addition, a degree of a misalignment between the position detection unit 12 and the surface measurement unit 20 may also be obtained.

After the alignment unit 22 determines whether the position detection unit 12 is linearly aligned with the surface measurement unit 20, the second driving part 16 and/or the third driving part 18 operate to move at least one of the position detection unit 12 and/or the surface measurement unit 20 to linearly align the position detection unit 12 and the surface measurement unit 20.

A data line 30 may be additionally provided to feed back data concerning a misalignment between the position detection unit 12 and the surface measurement unit 20 into the position coordinate computing member 12a of the position detection unit 12. The position coordinate computing member 12a may be programmed to calculate amended position data obtained by compensating for a degree of the misalignment with the position data recognized by the position detection unit 12. Here, the amended position data indicate coordinates of a portion of the rear surface of the semiconductor substrate W whose surface photo voltage is measured by the surface measurement unit 20.

When the apparatus of the present invention additionally includes the data line 30, the first driving part 14 can be operated in accordance with the amended position data obtained by the degree of the misalignment between the position detection unit 12 and the surface measurement unit 20. In this case, the second and third driving parts 16 and 18 are not necessary to align the position detection unit 12 and the surface measurement unit 20. Hence, the second and third driving parts 16 and 18 may be omitted when the data line 30 is additionally installed in the apparatus of the present invention.

Figure 4:
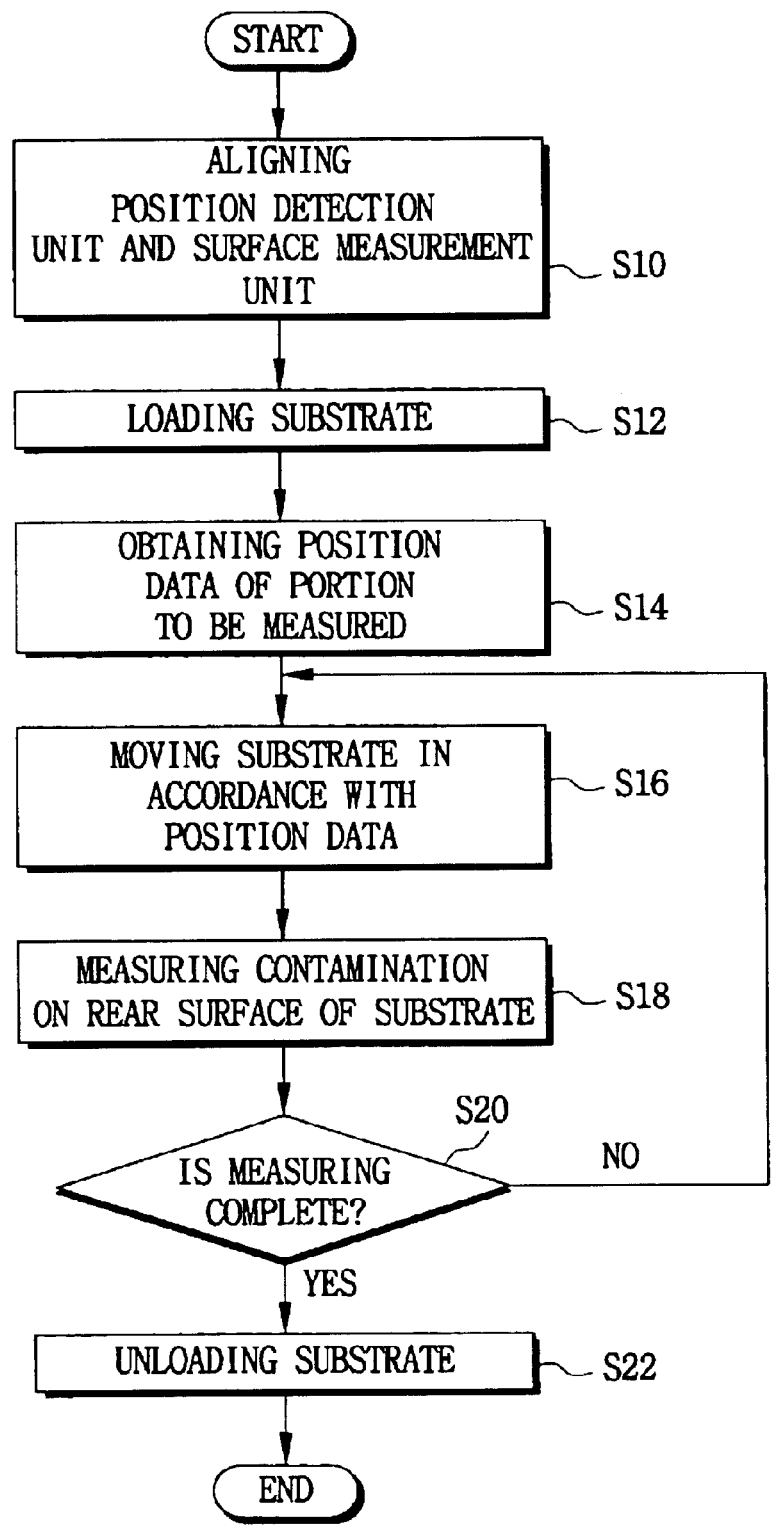
FIG. 4 is a flow chart illustrating a method for measuring a metal contamination of a semiconductor substrate according to the first embodiment of the present invention.

FIG. 4 is a flow chart illustrating a method for measuring contamination of a semiconductor substrate caused by a metal according to the first embodiment of the present invention. In the method of the present embodiment for measuring the metal contamination of the semiconductor substrate according to the first embodiment of the present invention, the contamination of the semiconductor substrate W caused by the metal can be determined using the apparatus as shown in FIGS. 1 and 2.

Initially, in step S10, the position detection unit 12 and the surface measurement unit 20 are aligned to exactly match a portion of the semiconductor substrate W recognized by the position detection unit 12 with the portion of the semiconductor substrate W whose surface photo voltage is measured by the surface measurement unit 20. More particularly, the position detection unit 12 is linearly aligned with the surface measurement unit 20 while interposing the chuck 10 between the position detection unit 12 and the surface measurement unit 20. To precisely align the position detection unit 12 with the surface measurement unit 20, the light generating member 22a positioned at a side portion of the position detection unit 12 irradiates a light toward the light receiving sensor 22b attached to a side portion of the surface measurement unit 20. The light receiving sensor 22b detects a point having the highest intensity of the light, and then determines whether the previously set portion of the light receiving sensor 22b detects the point having the highest intensity of the light. When the previously set portion of the light receiving sensor 22b detects the point having the highest intensity of the light, the position detection unit 12 is linearly aligned with the surface measurement unit 20. If the previously set portion of the light receiving sensor 22b does not detect the point having the highest intensity of the light, the second driving part 16 connected to the position detection unit 12 and the third driving part 18 connected to the surface measurement unit 20 may be operated to move the position detection and surface measurement units 12 and 20, respectively. Thus, the previously set portion of the light receiving sensor 22b can detect the point having the highest intensity of the light.

Here, it may be necessary to operate only one of the second and third driving parts 16 and 18 to align the position detection unit 12 and the surface measurement unit 20. When the position detection unit 12 is linearly aligned to the surface measurement unit 20, the position detection and surface measurement units 12 and 20 do not move during a process for measuring contamination of the semiconductor substrate W.

In step S12, the semiconductor substrate W including the patterns formed thereon is loaded on the chuck 10. The chuck 10 supports the rear peripheral portion of the semiconductor substrate W. Accordingly, remaining portions of the semiconductor substrate W, except the rear peripheral portion held by the chuck 10, are exposed. After loading the semiconductor substrate W on the chuck 10, in step S14, the patterns on the substrate W are recognized to obtain the position data of the portion of the substrate W to be measured.

A process for obtaining the position data will now be described with reference to FIG. 5.

Figure 5:
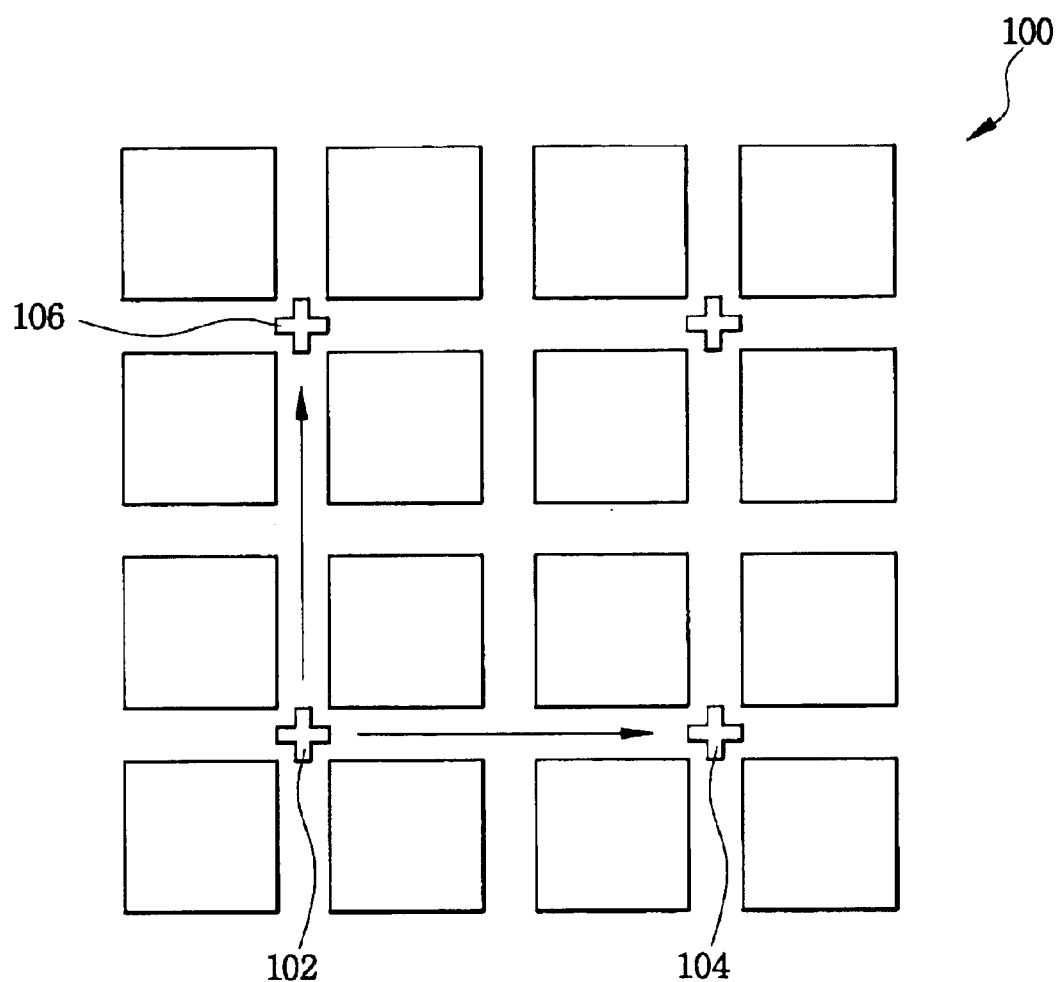
FIG. 5 illustrates a schematic plan view of a process for obtaining position data.

FIG. 5 illustrates a schematic plan view of a process for obtaining the position data.

Referring to FIG. 5, the image pick-up member 12a of the position detection unit 12 optically recognizes the patterns formed on the semiconductor substrate W, and then generates images 100 of the patterns. With the images 100 of the patterns, the shapes and the sizes of the patterns and the arranged condition of the patterns can be detected. To continuously detect the semiconductor substrate W including the patterns, the shapes and the sizes of the patterns and the arranged condition of the patterns are recorded into the position coordinate computing member 12b. Then, the chuck 10 is operated to align the semiconductor substrate W so that the patterns are positioned in parallel on the semiconductor substrate W.

One of the patterns formed on the semiconductor substrate W is defined as the reference pattern 102 that functions a reference point of the position coordinates. The reference pattern 102 may be one pattern easily recognized by the position detection unit 12.

The position coordinates corresponding to the portion of the substrate W to be measured are obtained on the basis of the reference pattern 102. For example, after the reference pattern 102 is designated as having coordinates (0, 0), coordinates of other patterns 104 and 106 that are identical to the reference pattern 102 but separated from the reference pattern 102 in an X-axis direction and a Y-axis direction, are designated on the basis of the coordinates of the reference pattern 102. Thus, coordinates of the portion of the semiconductor substrate W to be measured can be obtained. In this case, the portion of the semiconductor substrate W to be measured may be preferably designated as a predetermined portion of the semiconductor substrate W where the metal contamination frequently occurs during semiconductor manufacturing processes. The portion of the substrate W, where the metal contamination is frequently generated, can be recognized by continuously monitoring processing failures generated during the semiconductor manufacturing processes. The metal contamination may occur during an entire unit process, and particularly, may frequently occur during an ion implantation process.

Generally, the ion implantation process includes sequential steps of generating ion beams, passing specific ions from the ion beams, accelerating the ion beams, and implanting the ions into a substrate. In an accelerator for accelerating the ion beams, portions of the ions beams having high energies are scattered and collide with a surface of the accelerator. In this case, metal ions may be emitted from the surface of the accelerator and injected into the substrate, thereby causing metal contamination of the substrate. Thus, metal contamination may frequently occur at a portion of the substrate where the ions are implanted. Though the ion implantation process may be performed for implanting ions into an entire surface of the substrate, the ion implantation process may be executed for implanting the ions into a portion of the substrate only, for example, a portion of a peripheral region of the substrate where a transistor is positioned. Accordingly, the portion of the substrate W to be measured is preferably designated as the portion of the substrate W where the ions are implanted because the metal contamination is frequently generated at the ion implanted portion of the substrate W.

Referring back to FIG. 4, after the position data concerning the portion of the substrate to be measured are obtained, in step S16, the substrate W is moved. Here, the position detection and surface measurement units 12 and 20 are aligned with each other such that the portion of the substrate W recognized by the position detection unit 12 is identical to the portion of the substrate W whose surface photo voltage is measured by the surface measurement unit 20. When the substrate W is moved in accordance with the obtained position data, the surface measurement unit 20 can measure the level of contamination of the substrate W caused by the metal on the rear surface of the substrate W corresponding to the portion to be measured.

In step S18, the contamination caused by the metal is measured on the rear surface of the substrate W corresponding to the position to be measured.

Hereinafter, a process for measuring a level of contamination of the substrate caused by the metal will be described.

The modulated lights are irradiated onto predetermined portions of the rear surface of the substrate W positioned on the chuck 10. When the light is irradiated onto rear portions of the substrate W, surplus carriers may be generated on the rear surface of the substrate W to provide a space charge region in the rear surface of the substrate W. Centering the space charge region, a majority of the carriers is diffused into the substrate W while a minority of the carriers is accumulated on the rear surface of the substrate W.

As a result, an additional photo voltage is generated from the rear surface of the substrate W. The pick-up electrode 20b receives a photo voltage signal generated from the rear surface of the substrate W. The surface photo voltage is calculated using the amplified induced current. The diffusion distances of the minority carriers are calculated in accordance with the relation between the wavelengths of the irradiated lights and the surface photo voltage. The level of metal contamination of the substrate W can be determined according to the diffusion distances of the minority carriers.

Metal ions that correspond to sources of contamination of the substrate W, are rapidly and deeply diffused into the substrate W. More specifically, when metal ions are implanted onto the upper surface of the substrate W, the implanted metal ions are rapidly diffused from the upper surface of the substrate W toward a bottom surface of the substrate W. Therefore, contamination can be measured at portions of the rear surface of the substrate W corresponding to portions of the upper surface of the substrate W when the metal contamination of the substrate W is generated on the upper surface of the substrate W. The light irradiated onto the substrate W for measuring the surface photo voltage penetrates into the substrate W by approximately 150 $\mu$m.

Thus, the metal contamination can be measured from the surface of the substrate W to an inner portion of the substrate W by about 150 $\mu$m.

After the metal contamination of the substrate W is measured, in step S20, portions of the substrate to be measured are identified for further measurement. If measurement is not complete, the method returns to step S16 and the substrate W is moved for continued measuring of contamination at another portion of the substrate W. When the process for measuring contamination of the entire substrate W is complete, in step S22, the substrate W is unloaded from the chuck 10.

Figure 6:
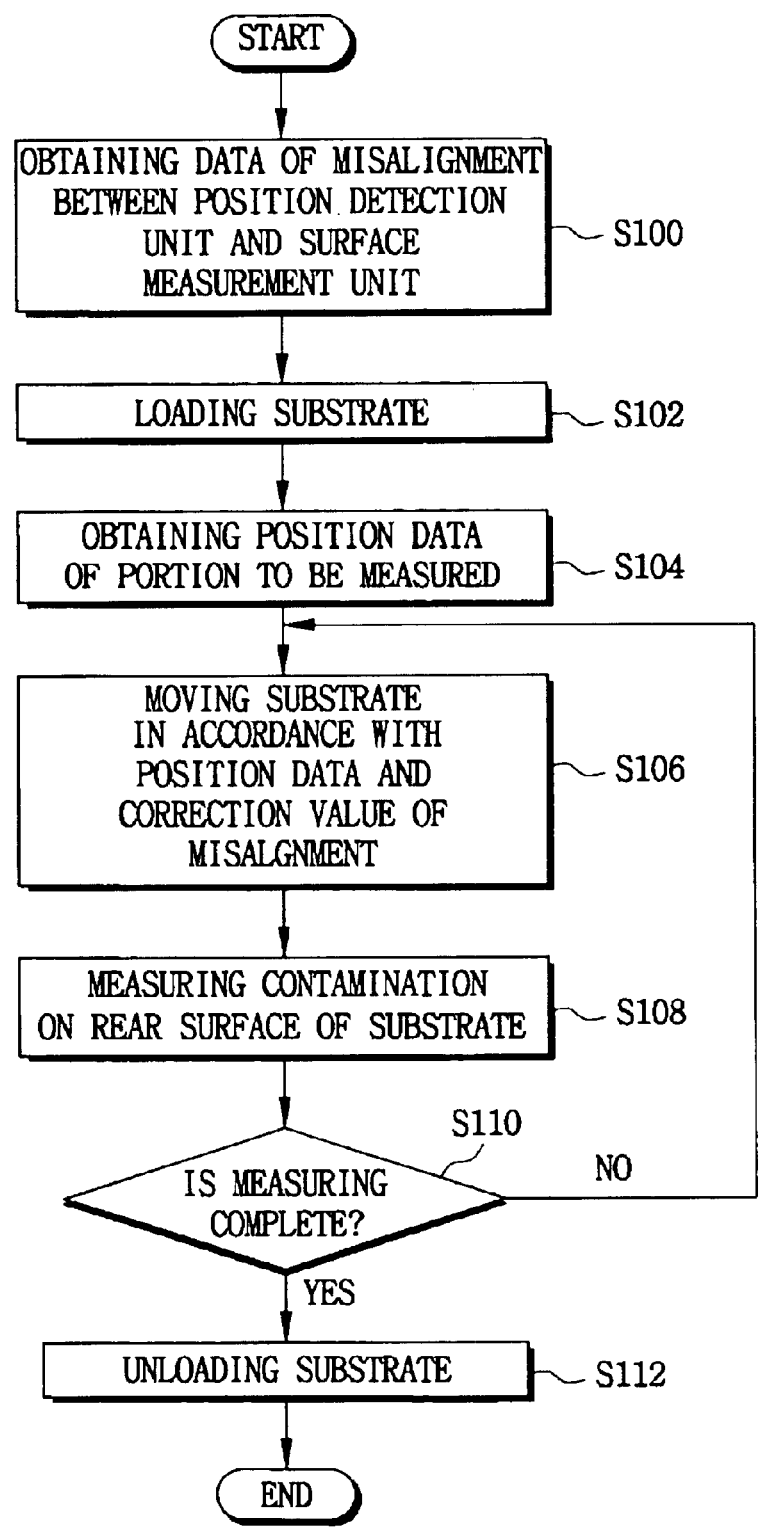
FIG. 6 is a flow chart illustrating a method for measuring contamination of a semiconductor substrate caused by a metal according to a second embodiment of the present invention.

FIG. 6 is a flow chart illustrating a method for measuring metal contamination of a semiconductor substrate according to a second embodiment of the present invention.

In the second embodiment, the method for measuring contamination of the semiconductor substrate is similar to that of the above-described first embodiment except for an omission of the step for aligning the position detection and surface measurement units to match the portion of the substrate recognized by the position detection unit with the portion of the substrate whose surface photo voltage is measured by the surface measurement unit.

In the method according to the second embodiment of the present invention, in step S100, it is determined whether the position of the substrate W recognized by the position detection unit 12 is identical to the portion of the substrate W whose surface photo voltage is measured by the surface measurement unit 20. Then, an amount of a misalignment between the position detection and the surface measurement units 12 and 20 is calculated. Particularly, the light generating member 22a positioned at the side portion of the position detection unit 12 irradiates light onto the light receiving sensor 22b disposed at the side portion of the surface measurement unit 20. The light receiving sensor 22b detects the intensities of the light and the highest intensity of the light. The light receiving sensor 22b decides whether the previously set portion of the light receiving sensor 22b detects the highest intensity of the light. When the highest intensity of the light is detected by the previously set portion of the light receiving sensor 22b, the position detection unit 12 is linearly aligned to the surface measurement unit 20. If the previously set portion of the light receiving sensor 22b does not detect the highest intensity of the light, the light receiving sensor 22b determines a degree that the highest intensity of the light deviates from the previously set portion of the light receiving sensor 22b. The calculated correction value of the misalignment is used to align the highest intensity of the light with the previously set portion of the light receiving sensor 22b, thereby aligning the highest intensity of the light and the previously set portion of the light receiving sensor 22b.

Then, in step S102, the substrate W including the patterns formed thereon is loaded on the chuck 10. The chuck 10 supports the rear peripheral portion of the substrate W.

The patterns formed on the substrate W are recognized by the position detection unit 12, and, in step S104, the position data of the portion of the substrate W to be measured are obtained using the position detection unit 12.

In step S106, the loaded substrate W is moved to measure the surface photo voltage at the rear portion of the substrate W corresponding to the portion of the substrate W to be measured after obtaining the position data of the portion to be measured and the correction value of the misalignment. In this case, the position detection unit 12 may not align with the surface measurement unit 20 because the portion of the substrate W recognized by the position detection unit 12 may not match the portion of the substrate W whose surface photo voltage is measured by the surface measurement unit 20. As a result, when the substrate W is moved in accordance with the position data of the portion of the substrate W to be measured, the surface measurement unit 20 may not measure the level of metal contamination of the substrate W at the rear surface of the substrate W corresponding to the portion to be measured. In order to exactly measure the contamination of the substrate W at the rear portion of the substrate W, corrected position data are calculated by compensating the position data obtained by the position detection unit 12 with the correction value of the misalignment between the highest intensity of the light and the previously set portion of the light receiving sensor 22$b$. The first driving part 18 then moves the loaded substrate W using the corrected position data so that the surface photo voltage can be measured at the rear portion of the substrate W corresponding to the portion of the substrate W to be measured.

In step S108, the level of metal contamination of the substrate W is measured on the rear surface of the substrate W.

In step S110, portions of the substrate still to be measured are identified for further measurement and the method returns to step S106, wherein the substrate W is moved for measuring the contamination of another portion of the substrate W. When the process for measuring contamination of the entire portion of the substrate W is complete, in step S112, the substrate W is unloaded from the chuck 10.

As described above, in accordance with the present invention, contamination of a substrate may be directly measured on a rear surface of the substrate even if the substrate has patterns formed on the front surface of the substrate. In addition, metal contamination of the substrate can be selectively measured with respect to a particular portion of the substrate. Accordingly, the method for measuring a level of contamination of the substrate may be selectively performed for portions of the substrate where contamination frequently occurs during the semiconductor manufacturing processes.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for measuring contamination of a semiconductor substrate, comprising:
    loading a substrate including patterns formed thereon onto a chuck;
    obtaining position data of a portion of the substrate to be measured by recognizing the patterns formed on the substrate;
    moving the substrate in accordance with the position data to measure a rear portion of the substrate corresponding to the portion of the substrate to be measured; and
    selectively measuring contamination of the substrate caused by a metal at the rear portion of the substrate corresponding to the portion of the substrate to be measured.

2. The method as claimed in claim 1, wherein obtaining the position data comprises:
    aligning a position of the substrate by optically recognizing shapes of the patterns formed on the substrate;
    defining a reference pattern among the patterns on the substrate; and
    obtaining position coordinates of the portion of the substrate to be measured using the reference pattern.

3. The method as claimed in claim 1, further comprising:
    aligning a position detection means with a surface measurement means before loading the substrate so that the position detection means is linearly aligned with the measurement means,
    wherein the portion of the substrate to be measured has a position identical to a position of the rear portion of the substrate.

4. The method as claimed in claim 3, wherein aligning the position detection means comprises:
    irradiating light from the position detection means;
    sensing the irradiated light by the surface measurement means;
    determining whether a previously set portion of the surface measurement means detects a highest intensity of a light; and
    moving either the position detection means or the surface measurement means to detect the highest intensity of the light by the previously set portion of the surface measurement means.

5. The method as claimed in claim 3, wherein the substrate is moved according to the position data recognized by the position detection means.

6. The method as claimed in claim 1, further comprising:
    obtaining a correction value of a misalignment between a position detection means and a surface measurement means by determining whether the portion of the substrate to be measured has a position identical to a position of the rear portion of the substrate prior to loading the substrate.

7. The method as claimed in claim 6, wherein moving the substrate further comprises:
    calculating a corrected position data by compensating the position data with the correction value of the misalignment; and
    moving the substrate in accordance with the corrected position data.

8. The method as claimed in claim 1, wherein selectively measuring contamination of the substrate further comprises:
    detecting a photo voltage at the rear portion of the substrate corresponding to the portion of the substrate to be measured; and
    measuring levels of contamination of an interior and a surface of the substrate caused by metal ions using the detected photo voltage.

9. The method as claimed in claim 1, wherein ions are implanted at the portion of the substrate to be measured.

10. An apparatus for measuring contamination of a semiconductor substrate, comprising:
    a chuck for loading a substrate;
    a position detection means for recognizing a front surface of the loaded substrate to obtain position data of a portion of the substrate to be measured;
    a first driving part coupled to the chuck for moving the chuck in accordance with the position data to measure a rear portion of the substrate corresponding to the portion of the substrate to be measured; and
    a surface measurement means disposed under the chuck for selectively measuring contamination of the substrate caused by a metal at the rear portion of the substrate.

11. The apparatus as claimed in claim 10, wherein the position detection means further comprises:
- an image pick-up member for obtaining images of patterns formed on the substrate by optically recognizing the patterns on the substrate positioned on the chuck; and
- position coordinate computing member for defining a reference pattern on the substrate using the images of the patterns obtained from the image pick-up member, and for calculating positions of the substrate as position coordinates using the reference pattern.

12. The apparatus as claimed in claim 10, wherein image pick-up member comprises a charge-coupled device (CCD).

13. The apparatus as claimed in claim 10, wherein the position coordinate computing member comprises a memory device for storing shapes and sizes of the patterns, and for storing an arrangement condition of the patterns.

14. The apparatus as claimed in claim 10, further comprising:
- a second driving part connected to the position detection means for moving the position detection means.

15. The apparatus as claimed in claim 10, further comprising:
- an alignment means for aligning the position detection means with the surface measurement means.

16. The apparatus as claimed in claim 15, wherein the alignment means further comprises:
- a light generating member disposed at a side position of the position detection means for irradiating light toward the surface measurement means; and
- a light receiving sensor disposed at a side portion of the surface measurement means for receiving the light irradiated from the light generating member.

17. The apparatus as claimed in claim 16, wherein light emitted from the light generating member comprises a laser.

18. The apparatus as claimed in claim 16, wherein the light receiving sensor detects a highest intensity of a light, and a degree that a previously set portion of the light receiving sensor deviates from the highest intensity of the light.

19. The apparatus as claimed in claim 16, further comprising:
- a data line connected to the light receiving sensor for feeding back a degree of a misalignment between the position detection means and the surface measurement means into the position coordinate computing member.

20. The apparatus as claimed in claim 10, wherein the surface measurement means further comprises:
- a light source for irradiating modulated light onto a predetermined portion of a rear surface of the substrate disposed on the chuck;
- a pick-up electrode for receiving a surface photo voltage signal from the rear surface of the substrate where the modulated light is irradiated;
- an amplifier connected to the pick-up electrode for amplifying a current induced by the pick-up electrode; and
- a detecting member for detecting a surface photo voltage using the amplified induced current.

21. The apparatus as claimed in claim 10, further comprising:
- a third driving part connected to the surface measurement means for moving the surface measurement means.

* * * * *